(12) United States Patent
Okada et al.

(10) Patent No.: US 7,315,070 B2
(45) Date of Patent: Jan. 1, 2008

(54) FINGERPRINT SENSOR PACKAGE

(75) Inventors: Akira Okada, Kawasaki (JP); Mitsuru Sato, Kawasaki (JP); Hideo Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/960,990

(22) Filed: Oct. 12, 2004

(65) Prior Publication Data

US 2005/0263836 A1    Dec. 1, 2005

(30) Foreign Application Priority Data

Jun. 1, 2004    (JP)    ............................ 2004-163470

(51) Int. Cl.
*H01L 29/84*    (2006.01)
*G06K 9/00*    (2006.01)

(52) U.S. Cl. .................. 257/415; 382/124; 382/125; 382/126

(58) Field of Classification Search ................ None
See application file for complete search history.

(56) References Cited

U.S. PATENT DOCUMENTS 5,818,956 A * 10/1998 Tuli ...................... 382/126
5,991,467 A * 11/1999 Kamiko .................. 382/312
6,310,371 B1 * 10/2001 Hung ..................... 257/252
6,392,143 B1 * 5/2002 Koshio .................. 174/52.4
6,548,909 B2 * 4/2003 Brofman et al. ............ 257/777
2003/0068072 A1 * 4/2003 Hamid .................... 382/124

FOREIGN PATENT DOCUMENTS

JP    9-126918    5/1997
JP    2003-235830    *    8/2003

\* cited by examiner

*Primary Examiner*—Andy Huynh
*Assistant Examiner*—Hoang-Quan Ho
(74) *Attorney, Agent, or Firm*—Westerman, Hattori, Daniels & Adrian, LLP.

(57) ABSTRACT

A fingerprint sensor package includes an LSI chip for reading a fingerprint, a substrate having an external connection terminal and to which the LSI chip is fixed, and a chip fixing mechanism for fixing the LSI chip in a state where the LSI chip is deformed so as to form a curved surface, provided between the LSI chip and the substrate.

6 Claims, 6 Drawing Sheets

FINGERPRINT SENSOR PACKAGE

BACKGROUND OF THE INVENTION

1. Field of the Invention

The present invention generally relates to fingerprint sensor packages, more specifically, a package wherein an LSI (Large Scale Integrated circuit) chip for reading a fingerprint is exposed on a surface thereof.

2. Description of the Related Art

Recently and continuing, for improvement of security, a fingerprint identification apparatus is provided at an electronic device such as a personal computer or a cellular phone. It is necessary for the fingerprint identification apparatus to read the fingerprint and therefore a fingerprint sensor package for reading the fingerprint is provided at the fingerprint identification apparatus. It is required for the fingerprint identification apparatus to securely identify the fingerprint in order to improve the security and therefore it is desired to improve the precision of the identification of the fingerprint.

An LSI chip (fingerprint sensor) for reading a pattern of the fingerprint is installed in the fingerprint sensor package. Generally, a capacitance sensor, a pressure sensor, or the like, is used as the fingerprint sensor. As the fingerprint sensor package, there are an area-type finger print sensor and a sweep-type finger print sensor. In the area-type finger print sensor, the fingerprint is read by positioning a finger on a fingerprint sensor having a plane configuration. In the sweep-type finger print sensor, the fingerprint is read by moving the finger on a liner-state finger sensor. Fingerprint data read by the finger sensor are sent to a fingerprint data process apparatus provided at an outside of the fingerprint sensor package. The fingerprint data are image-processed by the fingerprint data process apparatus so that the fingerprint is extracted.

Generally, the above-mentioned fingerprint sensor package includes an LSI chip (fingerprint sensor), a substrate, molded resin, an external connection terminal, and others. The LSI chip is used for detecting the fingerprint and is fixed to the substrate. See page 5 and FIG. 3 of Japan Laid-Open Patent Application 2003-235830.

The substrate is, for example, a resin substrate. Designated wiring patterns are formed on upper and lower surfaces. The wiring patterns formed on the upper and lower surfaces of the substrate are electrically connected to each other via a via-hole forming part which pierces the substrate. The LSI chip is provided on the upper surface of the substrate. The external connection terminal is provided at the lower surface of the substrate. The LSI chip and the wiring pattern formed on the upper surface of the substrate are electrically connected by a gold wire. A solder ball functioning as the external connection terminal is connected to the wiring pattern. Furthermore, molded resin is formed at an external circumference position of the LSI chip other than an area where the finger touches, in order to protect the gold wire or the like.

In the above-mentioned conventional fingerprint sensor package, both the LSI chip and the substrate have plane configurations. In addition, since the LSI chip is fixed to the substrate having a plane plate configuration and good mechanical strength, the LSI chip does not flexibly deform even in a case where the LSI chip is pushed by the finger.

However, since the LSI chip for detecting the fingerprint has a plane configuration which does not correspond to the configuration of the finger (namely curved configuration), there is a problem in that precision of reading the fingerprint is degraded. That is, in a case where the LSI chip has a plane configuration, if the finger is put on the LSI chip, a center position of the finger comes in contact with the LSI chip but a gap between the finger and the LSI chip is generated at both sides of the finger. That is, at both sides of the finger, the finger is separated from the LSI chip so that the fingerprint data sufficient for fingerprint identification cannot be generated by the LSI chip.

In order to solve the above-mentioned problem, there is a method in which a fingerprint reading process is implemented by strongly pushing the finger to the LSI chip. However, in this method, the workload of the person who implements the fingerprint identification increases so that operability may be degraded. Furthermore, since there are differences among individuals as for the force to push, the LSI may be pushed too strongly. Therefore, it is necessary to improve the strength of the LSI chip. However, in order to improve the strength of the LSI chip, for example, it is necessary to make the thickness of the substrate greater or increase the amount of the molded resin to be provided. This causes an increase of cost and size of the fingerprint sensor package.

SUMMARY OF THE INVENTION

Accordingly, it is a general object of the present invention to provide a novel and useful fingerprint sensor package.

Another and more specific object of the present invention is to provide a fingerprint sensor package having a simple structure whereby reading precision of reading the fingerprint can be improved.

The above object of the present invention is achieved by a fingerprint sensor package, including:
  an LSI chip for reading a fingerprint;
  a substrate having an external connection terminal and to which the LSI chip is fixed; and
  a chip fixing mechanism for fixing the LSI chip in a state where the LSI chip is deformed so as to form a curved surface, provided between the LSI chip and the substrate.

Here, in the following description and all of the claims, the curved surface means a curved configuration corresponding to a finger configuration and a configuration similar to this.

According to the above-mentioned invention, since the chip fixing mechanism for fixing the LSI chip in a state where the LSI chip is deformed so as to form the curved surface is provided, it is possible to make the configuration of the LSI chip similar to a finger configuration. Hence, it is possible to improve reading precision of the fingerprint with a simple structure.

The chip fixing mechanism may be a spacer in which a surface connected to the substrate is a plane surface and a surface connected to the LSI chip is the curved surface.

According to the above-mentioned invention, the spacer is connected to the substrate and the LSI chip at a wide range of an area. Therefore, even if the LSI chip is curved, it is possible to fix the LSI chip in a high mechanical strength state.

The chip fixing mechanism may be a plurality of posts which form the curved surface and have different heights.

According to the above-mentioned invention, the LSI chip is connected in a state where the LSI chip is curved by a plurality of posts which have different heights. Therefore, it is possible to fix the LSI chip easily at a low cost.

The above-mentioned object of the present invention is achieved by a fingerprint sensor package, including:

an LSI chip for reading a fingerprint;
a substrate having an external connection terminal and to which the LSI chip is fixed; and
a chip deformation accepting mechanism for forming a curved surface so that the LSI chip is flexibly deformed by being given a pushing pressure with a finger at the time of reading the fingerprint.

According to the above-mentioned invention, when the pushing pressure with the finger is given at the time of reading the fingerprint, the LSI chip is flexibly deformed so as to form the curved surface corresponding to the finger configuration, by the chip deformation accepting mechanism. Therefore, it is possible to improve reading precision of the fingerprint with a simple structure.

The chip deformation accepting mechanism may have a structure where the LSI chip is supported in a state where both ends of the LSI chip are supported and the LSI chip is separated from the substrate.

According to the above-mentioned invention, the LSI chip is supported in a state where both ends of the LSI chip are supported. Therefore, when the pushing pressure with the finger is given from the upper direction, the LSI chip is flexibly deformed easily so as to form the curved configuration, namely a configuration convex in a lower direction, corresponding to the finger configuration.

The chip deformation accepting mechanism may be a plurality of the external connection terminals which terminals have different sizes and structures where the LSI forms the curved surface when the LSI chip is mounted on the substrate.

According to the above-mentioned invention, since a plurality of external connection terminals which have different sizes are used, it is possible to deform the LSI chip with the substrate so as to form the curved configuration. Thus, by curving the LSI chip with the substrate, it is possible to improve the mechanical strength of the fingerprint sensor package.

The chip deformation accepting mechanism may be the substrate having a notch part provided on a surface thereof at a side connected to the LSI chip.

According to the above-mentioned invention, the notch part is provided on a surface at the side connected to the LSI chip, of the substrate. Therefore, it is possible to flexibly deform the LSI chip without an increase of the number of parts.

The chip deformation accepting mechanism may be the substrate which is partially removed.

According to the above-mentioned invention, since the substrate which is partially removed is used, it is possible to flexibly deform the LSI chip at low cost.

Other objects, features, and advantages of the present invention will become more apparent from the following detailed description when read in conjunction with the accompanying drawings.

DETAILED DESCRIPTION OF THE PREFERED EMBODIMENTS

A description is given below, with reference to the FIG. 1 through FIG. 6 of embodiments of the present invention.

Figure 1:
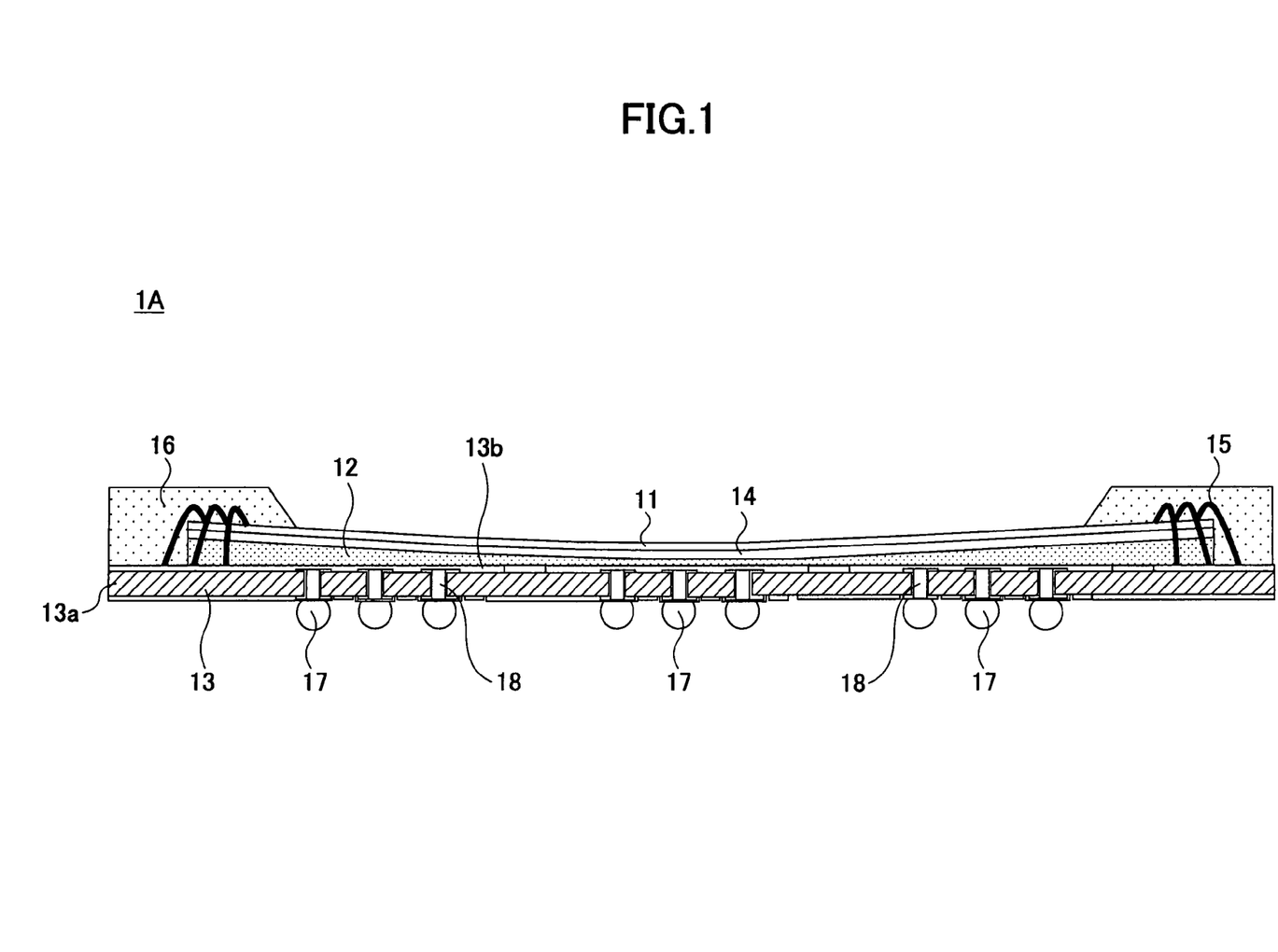
FIG. 1 is a cross-sectional view of a finger sensor package of a first embodiment of the present invention.

FIG. 1 is a cross-sectional view of a finger sensor package 1A of a first embodiment of the present invention. The fingerprint sensor package 1A of the first embodiment is a sweep-type fingerprint sensor package and uses an electrostatic capacity sensor as a fingerprint sensor. However, the present invention can be applied to other types of fingerprint sensor package.

As shown in FIG. 1, the fingerprint sensor package 1A includes an LSI chip 11, a substrate 13, molded resin 16, a solder ball 17, a spacer 12, and others. The fingerprint sensor as the electrostatic capacity sensor is formed at an upper surface of the LSI chip 11. The LSI chip 11 is made thin by a back surface polishing process so as to have flexibility.

The substrate 13 is a resin substrate. An upper surface wiring pattern 13*b* is formed on an upper surface of a basic material part 13*a* made of glass-epoxy material. The upper surface wiring pattern 13*b* is electrically connected to a via forming part 18 formed by piercing the basic material member 13*a*.

The above-mentioned LSI chip 11 is mounted on the upper surface of the substrate 13. The fingerprint sensor package 1A of the first embodiment has a structure where the spacer 12 is provided on the upper surface of the substrate 13 and the LSI chip 11 is mounted on the upper surface of the spacer 12. The lower surface of the spacer 12 is fixed to the substrate 13 by an adhesive (not shown). The LSI chip 11 is fixed to the upper surface of the spacer 12 by using a die bonding member 14.

An electrode pad (not shown) is formed at an outside part position in a longitudinal direction (in right and left directions in FIG. 1) of the LSI chip 11. A land (not shown) is formed at an outside part position of the upper surface wiring pattern 13*b* formed on the substrate 13.

Furthermore, the solder ball 17 as an external part connection terminal is provided at a position where the via forming part 18 of the substrate 13 is formed. Because of this, the solder ball 17 is electrically connected to the LSI chip 11 by the via forming part 18, the upper surface wiring pattern 13*b*, and a gold wire 15. In this embodiment, the solder ball 17 has a constant diameter. A solder resist (not shown) is formed on the upper surface of the respective wiring patterns 13*b* other than positions where the land and the via forming part 18 are formed.

The molded resin 16 is an epoxy resin, for example. The molded resin 16 is formed at an outside position in a longitudinal direction of the LSI chip 11 and the substrate 13 so as to seal the gold wire 15. However, at a part where the finger touches at the time of the fingerprint detection, the molded resin 16 is not formed and therefore the LSI chip 11 is exposed. By providing the molded resin 16, it is possible to protect the gold wire 15 and improve the reliability of the fingerprint sensor package 1A.

Details of the spacer 12 are discussed below. The spacer 12 is made of resin. It is preferable to use heat resisting resin as the material of the resin so that the spacer can hold out against heating at the time of molding of the molded resin 16. More specifically, epoxy resin and polyimide resin can be used as the material of the resin.

The lower surface of the spacer 12 is a plane surface while the upper surface has a curved configuration. Curvature of the curve is selected so as to correspond to the configuration of the finger. More specifically, the curvature is determined so that the contact area of the finger is largest in a case where a finger having the standard finger configuration, which is a configuration of an average finger, touches.

As described above, the LSI chip 11 is fixed to the upper surface of the spacer 12 by using the die bonding material 14. The LSI chip 11 has a width equal to or less than 300 μm and made by applying the back surface polishing process and therefore has a flexible structure by being made thin. Accordingly, the LSI chip 11 is deformed along the curved surface of the spacer 12 so as to have the curved surface, and is fixed to the spacer 12.

As described above, the upper surface of the spacer 12 has the curved configuration corresponding to the standard finger configuration. Therefore, the LSI chip 11 fixed to the spacer 12 also has a configuration corresponding to the standard finger configuration. Therefore, in a case where a process for reading a fingerprint is performed by using the fingerprint sensor package 1A of this embodiment, it is possible to make the contact area of the finger and the LSI chip 11 large. As a result of this, it is possible to read the fingerprint with high precision. Furthermore, since the LSI chip 11 is fixed to the whole surface of the spacer 12, as described above, it is possible to sustain the mechanical strength of the fingerprint sensor package 1A even if the LSI chip 11 is made thin, and therefore it is possible to improve the reliability of the fingerprint sensor package 1A.

Next, the second embodiment of the present invention is discussed.

Figure 2:
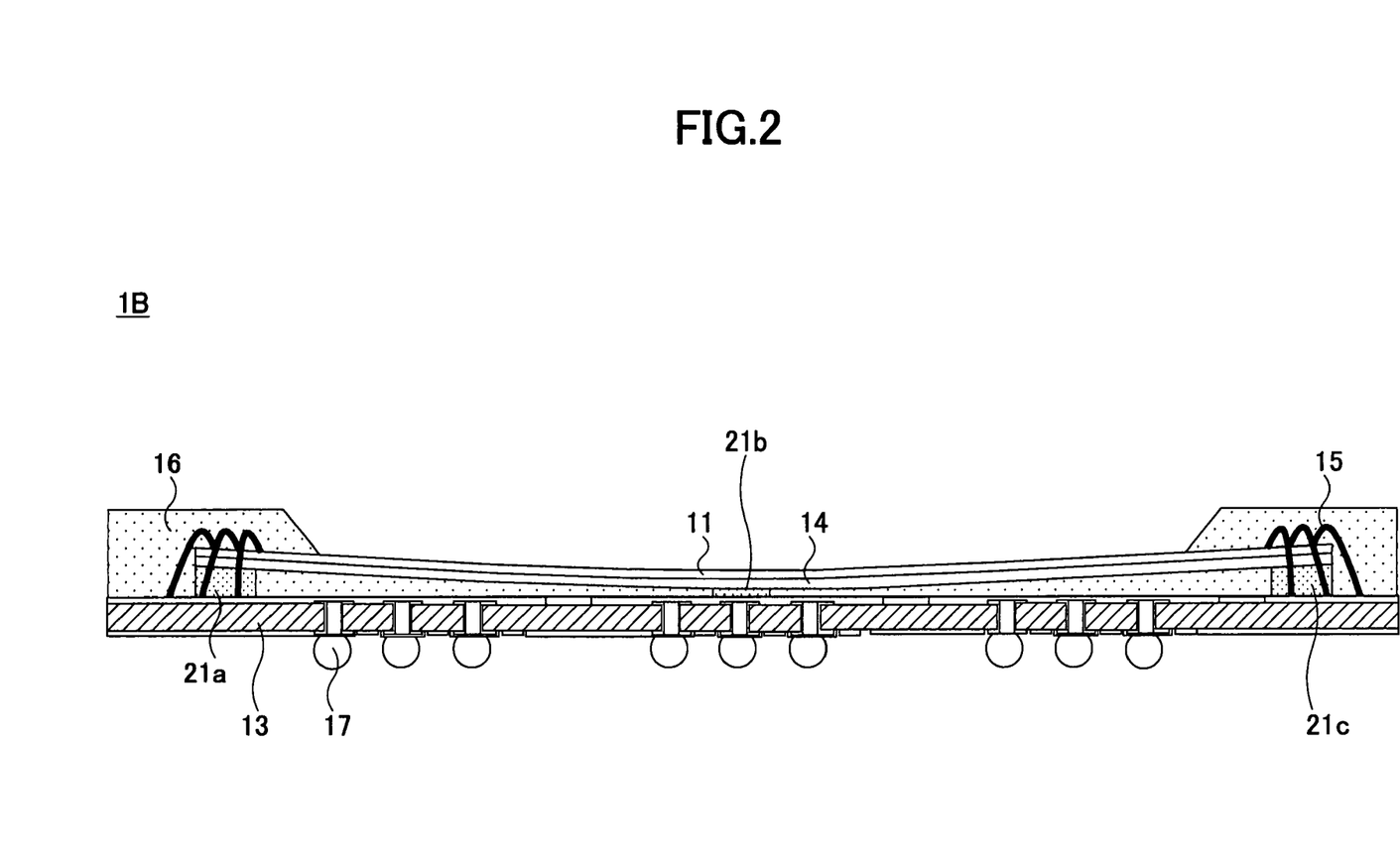
FIG. 2 is a cross-sectional view of a finger sensor package of a second embodiment of the present invention.

FIG. 2 is a cross-sectional view of a finger sensor package 1B of the second embodiment of the present invention. In FIG. 2 and also FIG. 3 through FIG. 6 for the third through sixth embodiments, parts that are the same as the parts of the fingerprint sensor package 1A of the first embodiment shown in FIG. 1 are given the same reference numerals, and explanation thereof is omitted.

The fingerprint sensor package 1B of the second embodiment has a structure where the LSI chip 11 is fixed to the substrate by using plural posts 21a-21c having different heights and cylindrical-shaped configurations. More specifically, the posts 21a and 21c have the same heights and are provided at both sides of the LSI chip 11. The post 21b has a height lower than the heights of the posts 21a and 21c and is provided at a substantially center position of the LSI chip 11. The posts 21a through 21c are, as well as the spacer, formed by a heat resisting resin.

Lower ends of the posts 21a through 21c are fixed to the substrate 13 and the LSI chip 11 is fixed to the upper ends of the posts 21a through 21c. When the LSI chip 11 is fixed to the upper ends of the posts 21a through 21c, the LSI chip 11 is curved so as to correspond to the heights of the posts 21a through 21c. At this time, the heights of the posts 21a through 21c are set so that the curved LSI chip 11 has a curved configuration corresponding to the standard finger configuration.

Therefore, in this embodiment, in a case where a process for reading the fingerprint is performed by using the fingerprint sensor package 1B, it is possible to make the contact area of the finger and the LSI chip 11 large. As a result of this, it is possible to read the fingerprint with high precision.

Furthermore, since the LSI chip 11 is supported in a state where not the whole surface of the LSI chip 11 is supported but plural parts are supported by the posts 21a through 21c, it is possible to reduce costs as compared to a case where the spacer 12 discussed in the first embodiment is used.

After the LSI chip 11 is fixed on the posts 21a and 21c, a process for forming the molded resin 16 is performed. At this time, the molded resin 16 is forced into a gap part between the LSI chip 11 and the substrate 13. Accordingly, it is possible to securely hold the LSI chip 11. Hence, even if the fingerprint sensor package is made thin, it is possible to maintain good mechanical strength of the finger sensor package 1B and therefore it is possible to improve reliability of the fingerprint sensor package.

Although only 3 posts 21a through 21c are shown in the cross-sectional view in FIG. 2, the number of the posts is not limited to this and the posts may be properly provided. Furthermore, the configuration of the posts is not limited to the cylindrical-shape configuration but may be other configurations such as a prismatic configuration. Furthermore, if a designated reliability can be maintained, it is not always necessary to provide the molded resin 16 between the LSI chip 11 and the substrate 13.

Next, the third embodiment of the present invention is discussed.

Figure 3:
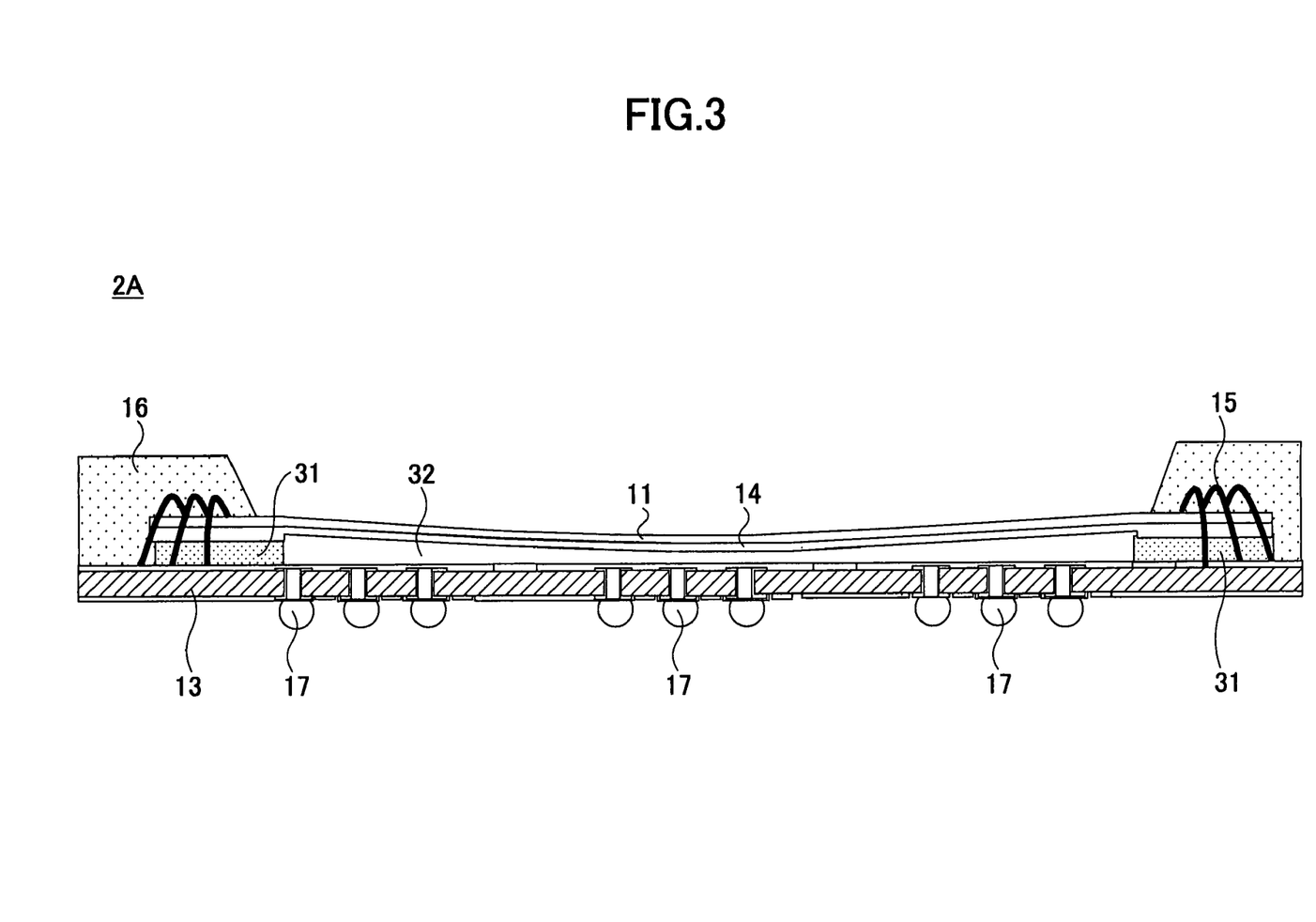
FIG. 3 is a cross-sectional view of a finger sensor package of a third embodiment of the present invention.

FIG. 3 is a cross-sectional view of a finger sensor package 2A of the third embodiment of the present invention. In the fingerprint sensor package 2A of the third embodiment, both ends of the LSI chip 11 are supported by the posts 31 so as to separate the LSI chip 11 from the substrate 13.

Therefore, the LSI chip 11 is supported in a state where both ends of the LSI chip 11 are supported by the posts 31 and a gap forming part 32 is formed between the LSI chip 11 and the substrate 13. As described above, the LSI chip 11 is made thin and therefore has a flexible structure. Accordingly, the LSI chip 11 has a structure flexible in upper and lower directions in FIG. 3 in an area where the gap forming part 32 is formed.

That is, the posts 31 and the LSI chip 11 function as a chip deformation accepting mechanism for flexibly deforming the LSI chip 11 so as to form a curved surface when the pushing pressure with the finger is given at the time of reading the fingerprint. It is preferable that the post 31 be made of the heat resisting resin and may be formed by impasto of a solder resist.

Because of the above-mentioned structure, when the pushing pressure with the finger is given, the LSI chip forms a curved configuration. Therefore, it is possible to make good adherence between the LSI chip 11 and the finger so that precision for reading the fingerprint can be improved. Furthermore, in this embodiment, the LSI chip 11 is supported in a state where both ends of the LSI chip are supported. Therefore, when the pushing pressure with the finger is given from the upper direction, the LSI chip is flexible deformed easily so as to form the curved configuration, namely a configuration convex in a lower direction, corresponding to the finger configuration.

Next, the fourth embodiment of the present invention is discussed.

Figure 4:
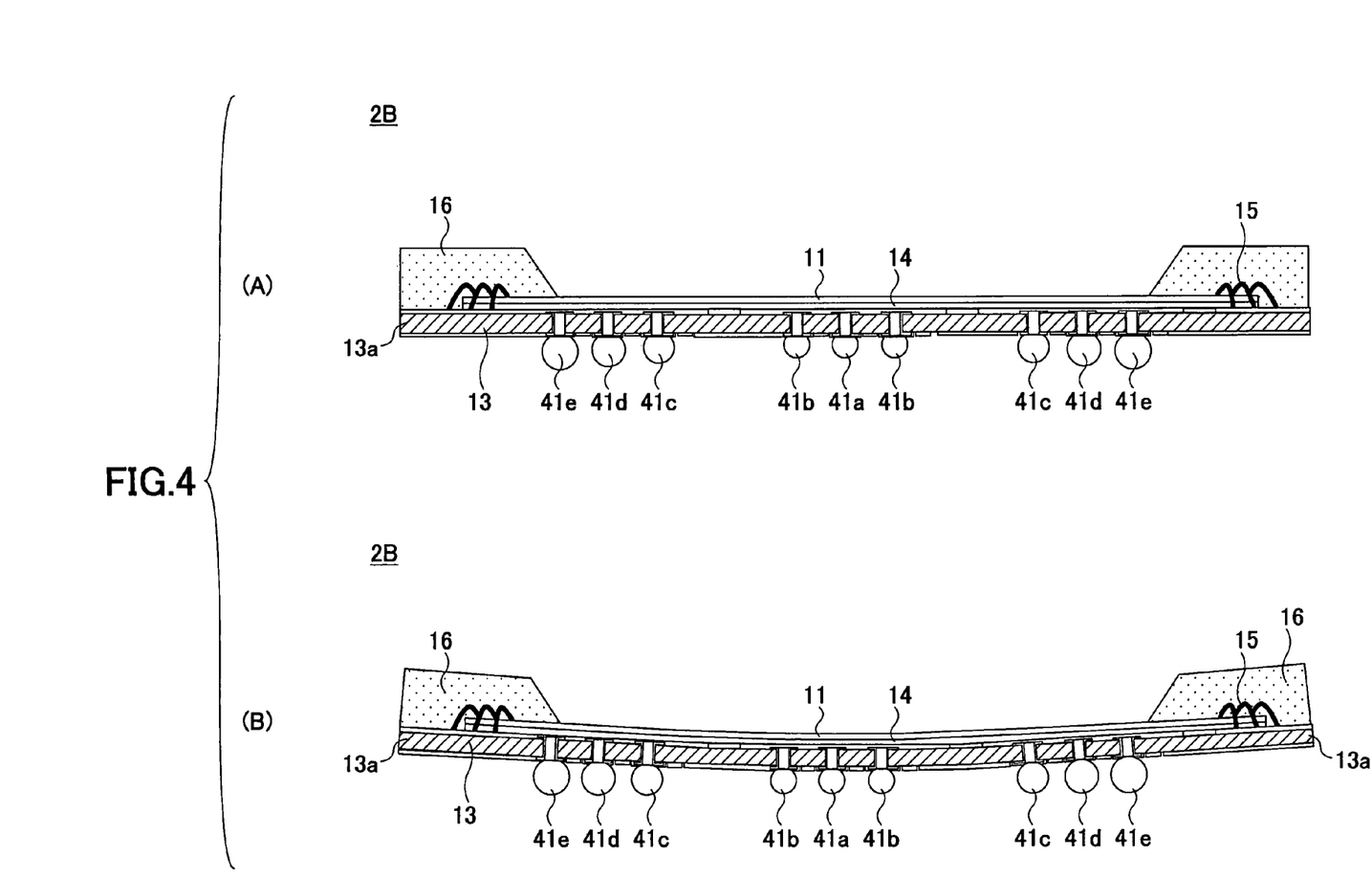
FIG. 4 is a cross-sectional view of a finger sensor package of a fourth embodiment of the present invention, more specifically, FIG. 4-(A) is a view showing a state before the fingerprint sensor package is mounted on a mounting substrate and FIG. 4-(B) is a view showing a state after the fingerprint sensor package is mounted on the mounting substrate.

FIG. 4 is a cross-sectional view of a finger sensor package 2B of the fourth embodiment of the present invention. More specifically, FIG. 4-(A) is a view showing a state before the fingerprint sensor package 2B is mounted on a mounting substrate. FIG. 4-(B) is a view showing a state after the fingerprint sensor package 2B is mounted on the mounting substrate.

In the fingerprint sensor package 2B of the fourth embodiment, solder balls 41a, 41b, 41c, 41d and 41e having different sizes are used. The solder balls 41a through 41e and the LSI chip 11 function as a chip deformation accepting mechanism whereby the LSI chip 11 is flexibly deformed and forms a curved surface when the fingerprint sensor package 2B is mounted on the mounting substrate.

As for diameters of the solder balls 41a through 41e, the diameter of the solder ball 41a positioned in the center part is shortest. The diameter becomes longer in the order of the solder ball being positioned from the solder ball 41a to the outside. Therefore, the solder ball 41e provided at the most exterior part has the longest diameter. Because of this, when the fingerprint sensor package 2B of the fourth embodiment is mounted on the mounting substrate, the LSI chip 11 is deformed with the substrate 13 so as to form the curved configuration.

Thus, in the fourth embodiment, since the LSI chip 11 is deformed with the substrate 13 so as to form the curved configuration, adherence between the LSI chip 11 and the finger is good and therefore it is possible to improve the precision of fingerprint reading. Furthermore, since the whole surface of the lower surface of the LSI chip 11 is fixed to the substrate 13, it is possible to improve the mechanical strength of the LSI chip 11.

In this embodiment, the substrate 13 may be flexible. A material more flexible than other embodiments is used for the basic material part 13a of the substrate 13.

Next, the fifth embodiment of the present invention is discussed.

Figure 5:
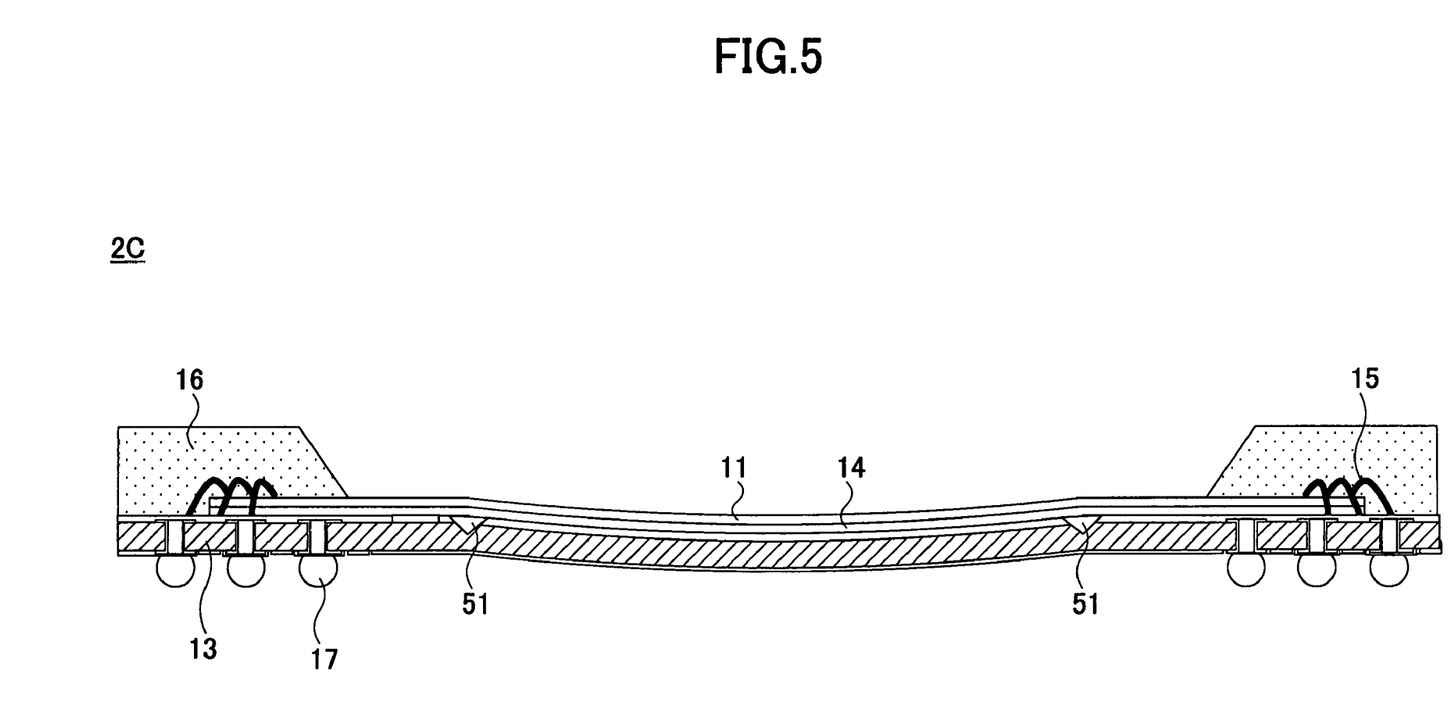
FIG. 5 is a cross-sectional view of a finger sensor package of a fifth embodiment of the present invention.

FIG. 5 is a cross-sectional view of a finger sensor package 2C of the fifth embodiment of the present invention. In the fingerprint sensor package 2C of the fifth embodiment, a notch forming part 51 is provided on a surface where the substrate 13 comes in contact with the LSI chip 11. In the fifth embodiment, the notch forming part 51 is formed at only an upper surface side of the substrate 13, namely the side on which the LSI chip 11 is mounted. The substrate 13 and the LSI chip 11 where the notch forming part 51 is formed function as a chip deformation accepting mechanism whereby the LSI chip 11 is flexibly deformed and forms a curved surface when the fingerprint sensor package 2B is mounted on the mounting substrate.

Thus, the substrate 13 may be flexibly deformed by forming the notch forming part 51 at the substrate 13. Therefore, in the fifth embodiment, since the LSI chip 11 forms a curved configuration when the pushing pressure with the finger is given, the adherence between the LSI chip 11 and the finger is good and therefore it is possible to improve the precision of fingerprint reading. Furthermore, the LSI chip 11 can maintain good mechanical strength for maintaining a state where the LSI chip 11 is maintained by the substrate 13. In addition, since the LSI chip 11 has a structure only for forming the notch forming part 51 at the substrate 13, it is possible to flexibly deform the LSI chip 11 without increasing the number of parts.

Next, the sixth embodiment of the present invention is discussed.

Figure 6:
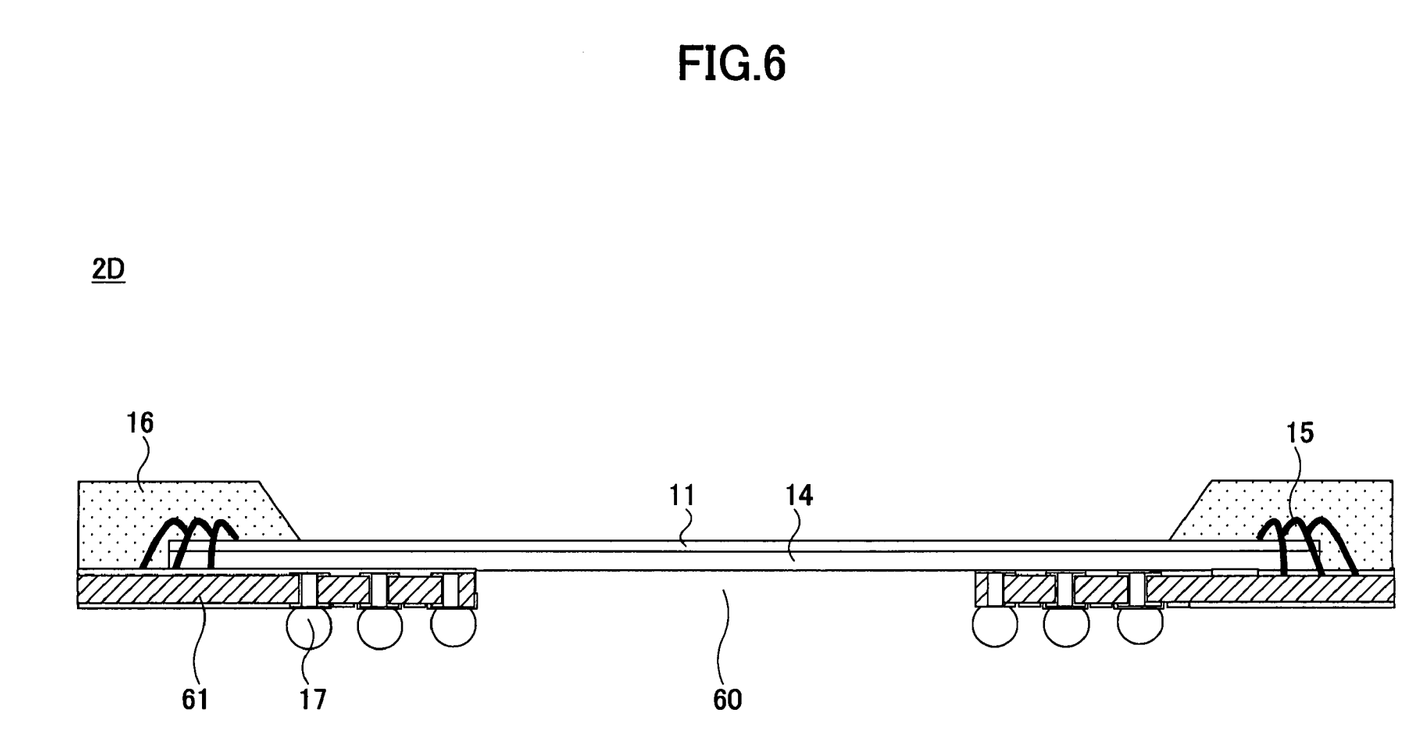
FIG. 6 is a cross-sectional view of a finger sensor package of a sixth embodiment of the present invention.

FIG. 6 is a cross-sectional view of a finger sensor package 2D of a sixth embodiment of the present invention. In the fingerprint sensor package 2D of the sixth embodiment, an opening forming part 60 is formed by removing a center part of a substrate 61. In the sixth embodiment, the solder balls 17 are formed in peripheral positions. The opening part 60 is formed in a center part of the substrate 61 excluding a part where the solder balls 17 are formed.

Under the above-discussed structure, an external peripheral position of the LSI chip 11, namely a position not facing the opening part 60, is supported by the substrate 61. Since the substrate 61 does not exist at a position facing the opening part 60, a flexible state is formed. The substrate 61 where the opening part 60 is formed and the LSI chip 11 function as a chip deformation accepting mechanism whereby the LSI chip 11 is flexibly deformed and forms a curved surface when a pushing pressure with a finger is given at the time of the fingerprint reading.

Therefore, in the sixth embodiment, since the LSI chip 11 forms a curved configuration when the pushing pressure with the finger is given, the adherence between the LSI chip 11 and the finger is good and therefore it is possible to improve the precision of fingerprint reading. Furthermore, since only the opening forming part 60 is formed in the substrate 61, it is possible to flexibly deform the LSI chip 11 without increasing the number of parts.

According to the sixth embodiment, since the substrate which is partially removed is used, it is possible to flexibly deform the LSI chip at low cost.

Thus, according to the present invention, in the fingerprint sensor package, more specifically the fingerprint sensor package using the electrostatic capacity type detection method, it is possible to improve reading precision of fingerprint reading with a simple structure.

The present invention is not limited to these embodiments, but variations and modifications may be made without departing from the scope of the present invention.

This patent application is based on Japanese Priority Patent Application No. 2004-163470 filed on Jun. 1, 2004 and the entire contents of which are hereby incorporated by reference.

What is claimed is:

1. A fingerprint sensor package, comprising:
an LSI chip for reading a fingerprint;
a substrate having an external connection terminal and to which the LSI chip is fixed; and
a chip fixing mechanism for fixing the LSI chip in a state where the LSI chip is deformed so as to form a uniform curved surface, provided between the LSI chip and the substrate;
wherein the chip fixing mechanism is a spacer in which a surface connected to the substrate is a plane surface and a surface connected to the LSI chip is the uniform curved surface.

2. A fingerprint sensor package, comprising:
an LSI chip for reading a fingerprint;
a substrate having an external connection terminal and to which the LSI chip is fixed; and
a chip fixing mechanism for fixing the LSI chip in a state where the LSI chip is deformed so as to form a uniform curved surface, provided between the LSI chip and the substrate;
wherein the chip fixing mechanism is a plurality to posts which form the curved surface and have different heights.

3. A fingerprint sensor package, comprising:
an LSI chip for reading a fingerprint;
a resin substrate to which the LSI chip is fixed, having an upper surface where a wiring pattern is formed and a lower surface where an external connection terminal is formed; and
a chip deformation accepting mechanism configured to fix the LSI chip to the resin substrate so as to form a curved surface and thereby the LSI chip is further flexibly deformed by being given a pushing pressure with a finger at the time of reading the fingerprint;

wherein the chip deformation accepting mechanism has a structure where the LSI chip is supported in a state where both ends of the LSI chip are supported and the LSI chip is separated from the substrate.

4. A fingerprint sensor package, comprising:

an LSI chip for reading a fingerprint;

a resin substrate to which the LSI chip is fixed, having an upper surface where a wiring pattern is formed and a lower surface where an external connection terminal is formed; and a chip deformation accepting mechanism configured to fix the LSI chip to the resin substrate so as to form a curved surface and thereby the LSI chip is further flexibly deformed by being given a pushing pressure with a finger at the time of reading the fingerprint;

wherein the chip deformation accepting mechanism is a plurality of the external connection terminals which terminals have different sizes where the LSI chip forms the curved surface when the LSI chip is mounted on the substrate.

5. A fingerprint sensor package, comprising:

an LSI chip for reading a fingerprint;

a resin substrate to which the LSI chip is fixed, having an upper surface where a wiring pattern is formed and a lower surface where an external connection terminal is formed; and a chip deformation accepting mechanism configured to fix the LSI chip to the resin substrate so as to form a curved surface and thereby the LSI chip is further flexibly deformed by being given a pushing pressure with a finger at the time of reading the fingerprint;

wherein the chip deformation accepting mechanism is the substrate having a notch part provided on a surface thereof at a side connected to the LSI chip.

6. A fingerprint sensor package, comprising:

an LSI chip for reading a fingerprint;

a resin substrate to which the LSI chip is fixed, having an upper surface where a wiring pattern is formed and a lower surface where an external connection terminal is formed; and a chip deformation accepting mechanism configured to fix the LSI chip to the resin substrate so as to form a curved surface and thereby the LSI chip is further flexibly deformed by being given a pushing pressure with a finger at the time of reading the fingerprint;

wherein the chip deformation accepting mechanism is the substrate which is partially removed.

* * * * *